United States Patent [19]
Orlov

[11] Patent Number: 5,121,012
[45] Date of Patent: Jun. 9, 1992

[54] CIRCUIT FOR MEASURING ELAPSED TIME BETWEEN TWO EVENTS

[75] Inventor: Dmitry H. Orlov, Boston, Mass.

[73] Assignee: Trustees of Boston University, Boston, Mass.

[21] Appl. No.: 731,597

[22] Filed: Jul. 17, 1991

[51] Int. Cl.⁵ .................... H03K 5/153; H03K 5/22
[52] U.S. Cl. .................... 307/517; 307/358; 307/234; 328/109; 328/110; 328/111; 328/112; 328/117
[58] Field of Search ............ 328/109–112, 328/117; 307/517, 358, 234

[56] References Cited

U.S. PATENT DOCUMENTS

4,672,238 6/1987 Nemoto .................... 307/358

Primary Examiner—Stanley D. Miller
Assistant Examiner—Margaret Rose Wambach
Attorney, Agent, or Firm—Kriegsman & Kriegsman

[57] ABSTRACT

A time-to-digital converter for converting a time interval into a digital signal output includes an input section for receiving signals corresponding to the start and stop of the time interval and outputting first and second electrical pulses corresponding in time thereto, a time scaling circuit for receiving the two pulses and producing a voltage pulse whose width is a scaled version of the time interval, an output voltage generator for receiving the voltage pulse and producing a voltage signal corresponding in amplitude to the width of the pulse, a buffer and reset circuit for buffering the voltage signal outputted by the output voltage generator and for resetting the buffering means after the voltage signal is passed through, and an analog to digital converter for converting the voltage signal into a digital signal. The time scaling circuit includes a pair of resistance-capacitance networks having different time constants and initial voltages that are close but not exactly equal and a comparator for receiving signals corresponding to the voltage in each resistance-capacitance network and producing a voltage pulse whose width is proportional to the time interval, the voltage pulse constituting a scaled version of the time interval.

7 Claims, 9 Drawing Sheets

CIRCUIT FOR MEASURING ELAPSED TIME BETWEEN TWO EVENTS

GOVERNMENT SUPPORT

This invention was made with government support under PHY-8914293 awarded by the National Science Foundation. The government has certain rights in the invention.

BACKGROUND OF THE INVENTION

The present invention relates to a circuit for use in scaling a time interval. The present invention also relates to a time-to-digital converter (TDC) which includes such a circuit.

There are many instances when it is desirable to either expand or compress a time interval. For example, when measuring timing differences between pulses from elementary particle detectors in high energy physics experiments, the timing differences, which can be on the order of about 15 to 50 nanoseconds, are usually magnified.

In the past, the expansion of such a time interval has been achieved using a circuit having two linear current sources of unequal amplitudes, an electronic switch and a capacitor. The two linear current sources are used to charge and discharge the capacitor, the larger current source being used to charge the capacitor during the input time interval. The capacitor voltage is then compared to a threshold voltage to produce the output time interval, the output time interval being the overall time during which the capacitor voltage is held above threshold. The circuit is normally coupled to a counter having a digital output. The counter is enabled during the period the capacitor is discharging so as to provide a digital signal output corresponding to that time period.

One of the problems with the above described system is that it is relatively slow. The reason it is relatively slow is that it uses a counter to measure the discharge time of a capacitor.

Accordingly it is an object of this invention to provide a new and improved system for scaling a time interval and producing a digital output corresponding to the scaled time interval.

It is another object of this invention to provide an improved time scaling circuit.

It is still another object of this invention to provide a system as described above which does not include a counter.

It is yet still another object of this invention to provide a time scaling circuit which does not include constant current sources.

SUMMARY OF THE INVENTION

A time scaling circuit constructed according to the teachings of the present invention includes a first resistance-capacitance network for producing a first electrical signal, said first resistance-capacitance network including switch means for receiving a first electrical pulse corresponding to the start of a time interval to be scaled and initiating in response thereto the decay of the first electrical signal, a second resistance-capacitance network for producing a second electrical signal, the second resistance-capacitance network including switch means for receiving a second electrical pulse corresponding to the completion of the time interval and initiating in response thereto the decay of the second electrical signal, the time constants of said first and second resistance-capacitance networks being different, said first and second electrical signals having about the same initial amplitude and a comparator for receiving the first and second electrical signals and providing an output pulse whose width is proportional to the time interval between the first and second electrical pulse and which corresponds to the time between when the two decaying signals are equal in amplitude and either the start or the stop of the time interval.

By properly selecting the values of time constants of the two resistance-capacitance networks, the time scaling circuit can be made to either stretch or compress the time interval, depending on the particular use desired for the circuit.

A time-to-digital converter (TDC) constructed according to the teachings of this invention includes an input section for receiving start and stop signals corresponding to the start and stop of a time interval and outputting first and second electrical pulses corresponding in time to said start and stop signals, a time scaling circuit for receiving the first and second electrical pulses and producing a voltage pulse whose width is a scaled version of the time interval between the first and second electrical pulses, an output voltage generator for receiving the voltage pulse from said time scaling circuit and producing a voltage signal whose amplitude is proportional thereto, means for buffering the voltage signal outputted by said output voltage generator and for resetting said voltage signal, an analog to digital converter for converting the voltage signal in the buffering and resetting means into a digital signal output and power supplies and reference voltage circuits for use in the time-to-digital converter.

One advantage of the TDC of this invention is that it does not include a counter. An advantage of the time scaling circuit of this invention is that it does not contain any constant current sources.

Various other features and advantages will appear from the description to follow. In the description, reference is made to the accompanying drawing which forms a part thereof, and in which is shown by way of illustration, a specific embodiment for practicing the invention. This embodiment will be described in sufficient detail to enable those skilled in the art to practice the invention, and it is to be understood that other embodiments may be utilized and that structural changes may be made without departing from the scope of the invention. The following detailed description is therefore, not to be taken in a limiting sense, and the scope of the present invention is best defined by the appended claims.

BRIEF DESCRIPTION OF THE DRAWINGS

In the drawings wherein like reference numerals represent like parts.

DETAILED DESCRIPTION OF PREFERRED EMBODIMENTS

The present invention is directed to a time scaling circuit. The invention is also directed to a time-to-digital converter using the time scaling circuit.

The time scaling circuit of this invention makes use of two decaying exponentials having about the same amplitudes initially but with different time constants. One of the exponentials is initiated by the start of the input time interval (i.e. the time interval to be scaled) while the other is initiated by the stop of the input time interval. The output time interval (i.e. the scaled time interval) can then be shown to be a linear function of the time constants of the two exponentials, this output time interval defined to be the time between the crossover of the two expontials (the time during decay when their amplitudes are equal) and either the start time or the stop time of the input time interval.

Figure 1:
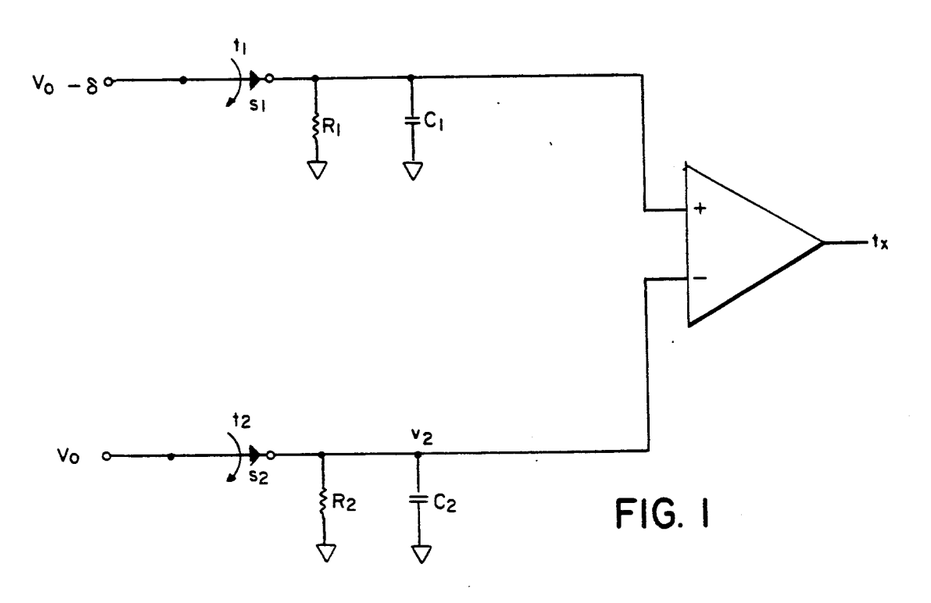
FIG. 1 is a schematic diagram useful in understanding the underlying theory of the time scaling circuit of this invention.
Figure 2:
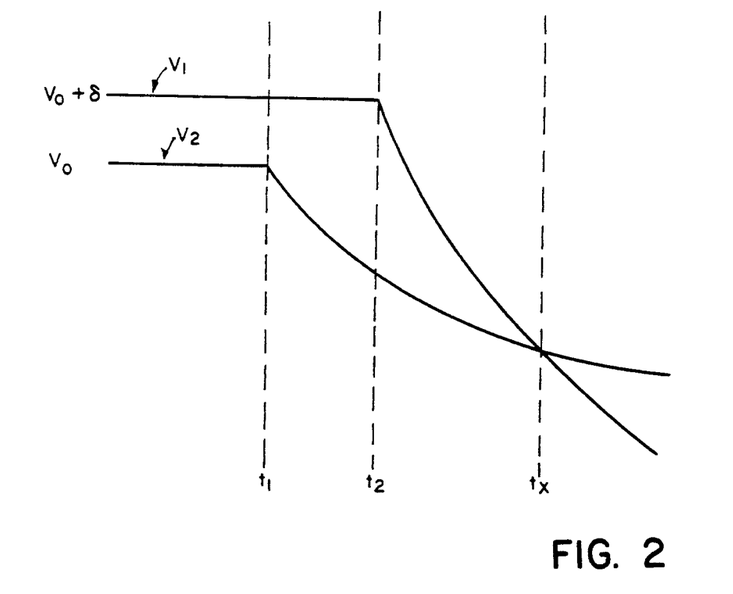
FIG. 2 are timing diagrams useful in understanding the underlying theory of the time scaling circuit of this invention.

The underlying theory of the time scaling circuit may be best understood by first looking at FIGS. 1 and 2. As can be seen, circuit 11 as shown in FIG. 1 and which illustrates the time scaling circuit of this invention in its simplest form, includes a first resistance-capacitance (RC) network 13 which contains resistor R1, capacitor C1 and switch S1 and a second (RC) network 15 which contains resistor R2, capacitor C2 and switch S2. RC networks 15 and 17 are coupled at their input ends to voltage source Vo and at their output ends to a comparator 19. The values of R1, C1, R2 and C2 are selected so that the time constants $\tau 1$ and $\tau 2$ for RC networks 15 and 17, respectively, are not equal.

When the two switches $S_1$ and $S_2$ are closed the voltages in the two RC networks will be Vo. However, when switches $S_1$ and $S_2$ are opened, i.e. first switch $S_1$ at time $t_1$ and then switch $S_2$ at time $t_2$, the voltages in their respective RC circuits will decay exponentially as shown in FIG. 2.

For generality, the exponentials have slightly different initial amplitudes, but this difference will be shown to introduce little error in output time interval. From FIG. 1, the exponentials have equal amplitudes at time $t=t_x$. Thus we have $$(V_o + \delta) e^{\frac{-t_x - t_2}{\tau_2}} = V_o e^{\frac{-t_x - t_1}{\tau_1}} \text{ giving}$$

$$\ln(V_o + \delta) - \frac{t_x}{\tau_2} + \frac{t_2}{\tau_2} = \ln V_o - \frac{t_x}{\tau_1} + \frac{t_1}{\tau_1}$$

From this we get $$t_x \left( \frac{1}{\tau_2} - \frac{1}{\tau_1} \right) = \ln \frac{V_o}{V_o + \delta} + \frac{t_2}{\tau_2} - \frac{t_1}{\tau_1} \text{ or}$$

-continued $$t_x = \frac{\tau_1 \tau_2}{\tau_1 - \tau_2} \ln \frac{V_o}{V_o + \delta} + t_2 \frac{\tau_2}{\tau_1 - \tau_2} - t_1 \frac{\tau_2}{\tau_1 - \tau_2}$$

The output time interval is now $$t_x - t_2 = \frac{\tau_1 \tau_2}{\tau_1 - \tau_2} \ln \frac{V_o}{V_o + \delta} + \frac{\tau_2}{\tau_1 - \tau_2} (t_2 - t_1) \text{ or} \quad (1)$$

$$t_x - t_1 = \frac{\tau_1 \tau_2}{\tau_1 - \tau_2} \ln \frac{V_o}{V_o + \delta} + \frac{\tau_1}{\tau_1 - \tau_2} (t_2 - t_1) \quad (2)$$

If we ignore for the moment the first term in Eqns. 1 and 2, we see that the output time intervals $t_x - t_2$ and $t_x - t_1$ are linear fractions of the input time interval $t_2 - t_1$.

For Eqn. 1 the output time interval is an expansion of the input time interval if $\tau_2 < \tau_1 < 2\tau_2$ and is a compression of the input time interval if $\tau_1 > 2\tau_2$.

For Eqn. 2 the output time interval can only be an expansion of the input time interval, this occuring when $\tau_2 \leq \tau_1$.

The difference in amplitude is $\delta$, appearing in the first term of Eqs. 1 and 2 will now be addressed. If we assume that $\delta$ is small compared to $V_o$, then the factor $$\ln \frac{V_o}{V_o + \delta}$$

simplifies to $-\delta/V_o$. Thus, the output time error term becomes $-\tau_1\tau_2/(\tau_1 - \tau_2)\delta/V_o$. Typically this is small compared to the desired term in Eqns. 1 and 2, and can therefore be ignored.

Figure 3:
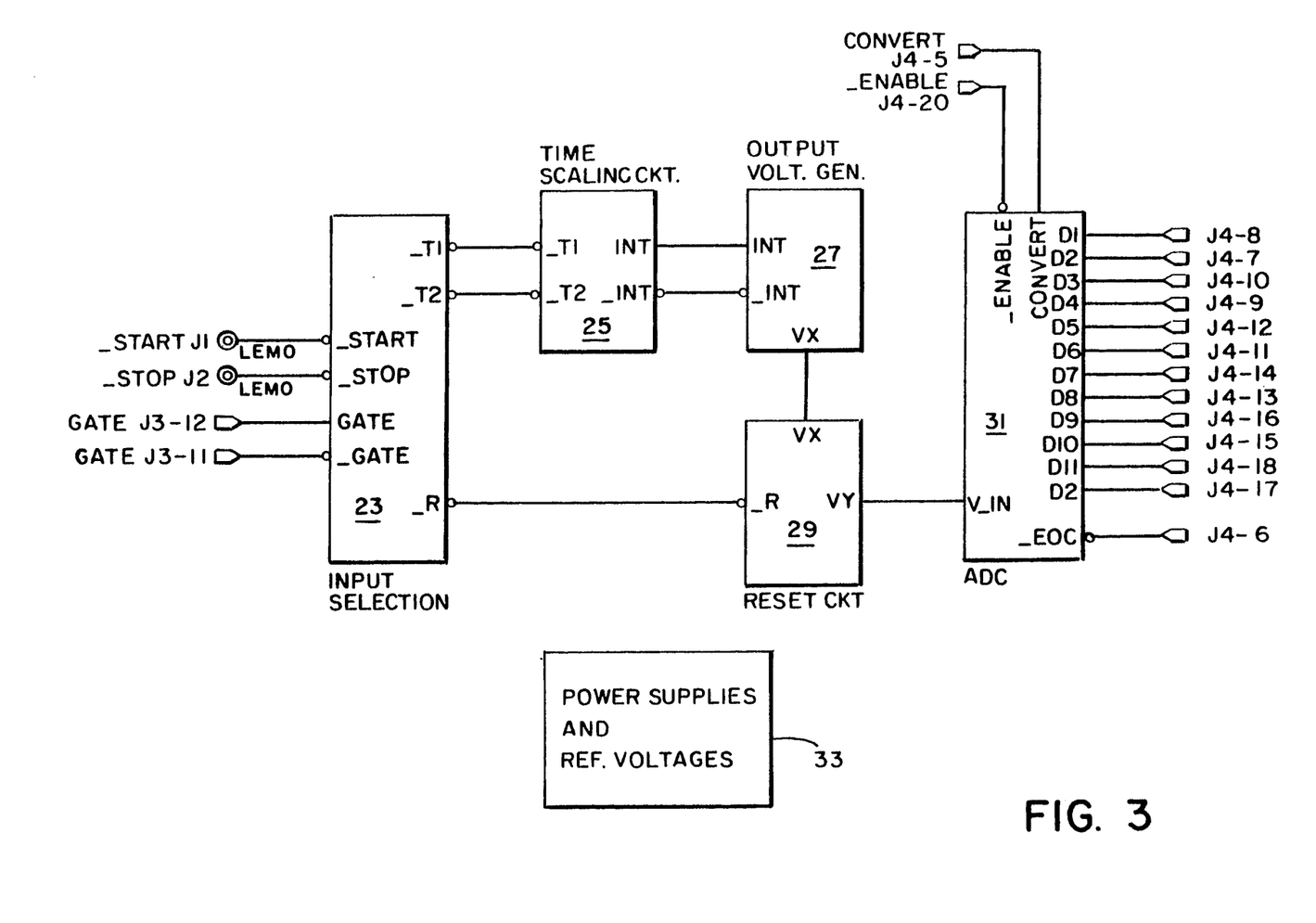
FIG. 3 is a block diagram of a time-to-digital converter (TDC) constructed according to this invention.

Referring now to FIG. 3, there is shown a block diagram of a TDC constructed according to the teachings of the present invention, the TDC being identified by reference numeral 21.

TDC 21 includes an input section 23, a time scaling circuit 25, an output voltage generator 27, a buffer and reset circuit 29, an analog-to-digital converter (ADC) circuit 31 and a set of power supplies and reference voltages 33.

Input section 23 receives start and stop signals corresponding to the beginning and end of a time interval to be measured at pins J1 and J2 and outputs a pair of timing signals $\overline{T1}$ and $\overline{T2}$. Input section 23 also receives GATE and $\overline{GATE}$ signals and outputs an $\overline{R}$ signal. Time scaling circuit 25, which has components sized so as to operate in a time expansion mode, receives the $\overline{T1}$ and $\overline{T2}$ signals from input section 23 and produces an INTEGRATE pulse signal INT whose width is equal to the difference in time between the $\overline{T1}$ and $\overline{T2}$ pulses multiplied by a number greater than one. Time scaling circuit 25 also outputs an inverse signal $\overline{INT}$. Output voltage generator 27 receives signals INT and $\overline{INT}$ from time scaling circuit 25 and outputs a voltage signal VX whose amplitude is proportional to the width of output pulse INT. Reset and buffer circuit 29 buffers the output signal VX from current switch 27 and sends it out to ADC 31 as output signal VY. Circuit 29 also receives the reset signal from input section 23 for resetting the buffer contained therein after the signal VX is sent out to ADC circuit 31. ADC circuit 31 converts output voltage VY, which is an analog signal, into a digital output, the digital output being over pins D1 through D12. Power supplies and reference voltages 33 provide the necessary voltages for the operation of TDC 21.

Figure 4:
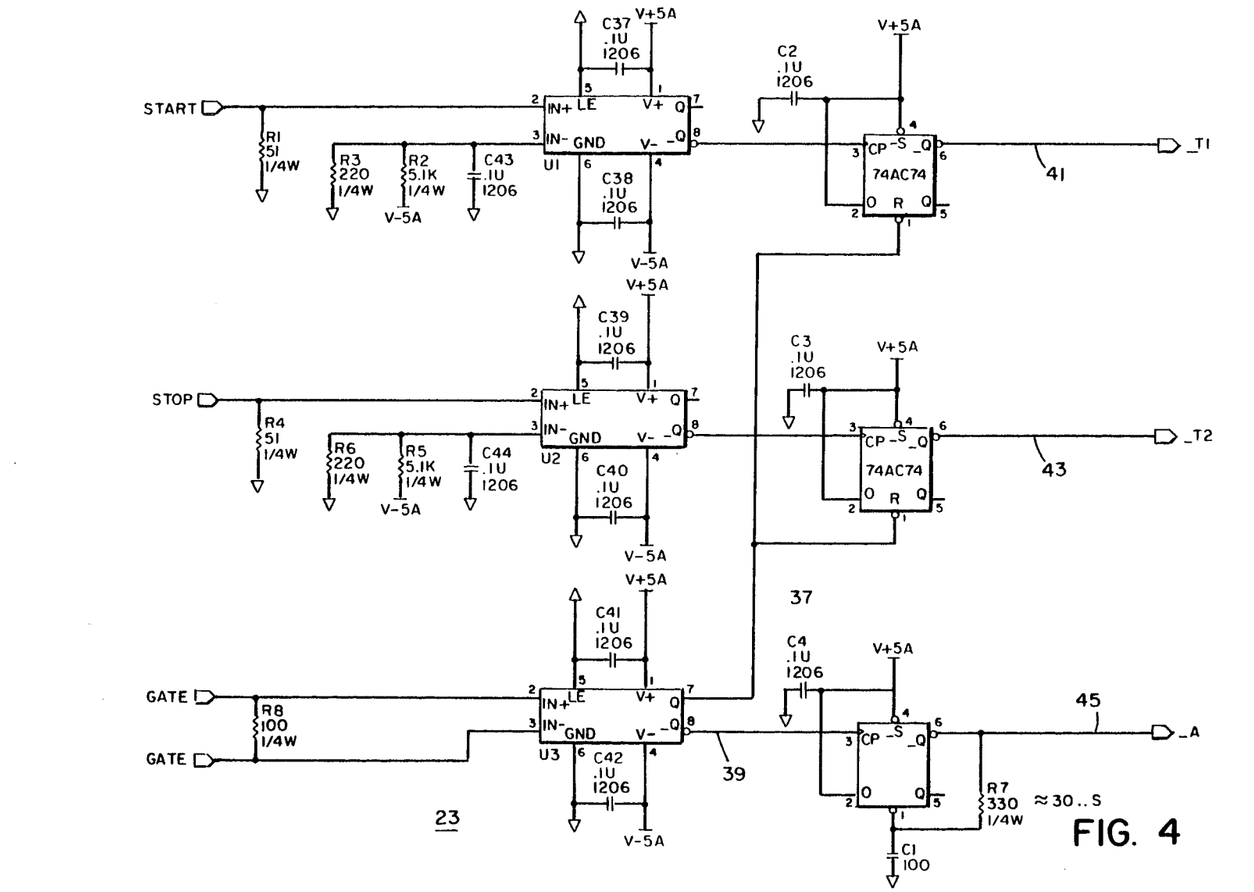
FIG. 4 is a schematic diagram of the input section in the TDC in FIG. 3.

Input section 23, which is shown in detail in FIG. 4, includes three comparators U1, U2 and U3. Comparators U1 and U2 receive start and stop signals, respectively, corresponding to the start and stop times of the time interval to be measured, compare the signals with threshold voltages and then produce output timing signals over lines 33 and 35, respectively. These output timing signals are then fed into flip-flops U4-A and U5-A, respectively. Comparator U3 receives GATE and $\overline{\text{GATE}}$ signals and outputs two signals, one over line 37 and the other over line 39. The signal over line 37 is used as an enable signal for flip-flops U4-A and U5-A while the signal over line 39 is fed into flip-flops U6-A. Flip-flop U4-A and U5-A take into account the enable signal from line 37, buffer timing signals start and stop and provide output timing signals T1 and T2, respectively, over lines 41 and 43, respectively. Flip-flop U6-A outputs a short pulse R over line 45 which is used as a result pulse in buffer and rest circuit 29. Input circuit 21 also includes associated resistors and capacitors used for conventional purposes such as setting up thresholds, filtering input voltages, terminating input lines and bypassing power supplies.

Figure 5:
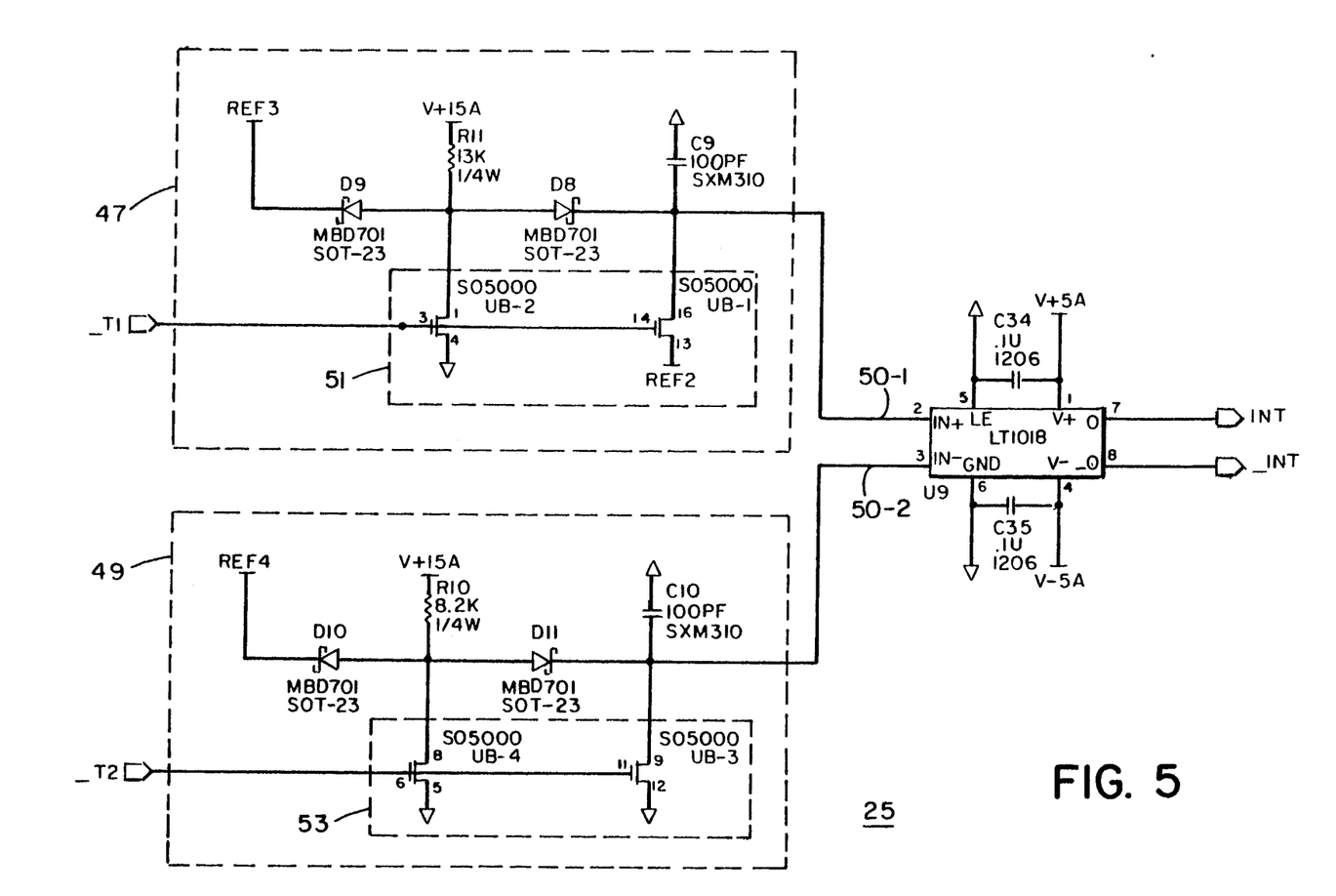
FIG. 5 is a schematic diagram of the time interval scaling circuit in the TDC in FIG. 3.

Time scaling circuit 25 shown in detail in FIG. 5 includes two resistance-capacitance (RC) networks 47 and 49 and a comparator U9.

RC network 47 includes a resistor R11, a capacitor C9, a pair of Schottky diodes D8 and D9 and a DMOS switch 51 having two sections U8-1 and U8-2. RC network 49 includes a resistor R10, a capacitor C10, a pair of Schottky diodes D10 and D11 and a DMOS switch 53 having two sections U8-3 and U8-4. RC network 47 differs from RC network 49 only in that it has a larger time constant ($\tau$).

The purpose of Schottky diodes D9 and D10 is to limit the voltages on C9 and C10, respectively, to within the input range on comparator U9. The purpose of Schottky diodes D8 and D11 is to ensure that the "on" resistances of the DMOS switches 51 and 53 do not contribute to their respective capacitor voltages. Reference voltages REF3 and REF4 prevent the input range on comparator U9 from being exceeded. RC network 47 receives timing signal T1 while RC network 49 receives timing signal T2.

Comparator U9 receives inputs from RC networks 47 and 49 over lines 50-1 and 50-2, respectively, and produces two output pulses INT and $\overline{\text{INT}}$ each of whose width is proportional to the stretched time difference between pulses $\overline{\text{T1}}$ and $\overline{\text{T2}}$.

Switches 51 and 53 in RC networks 47 and 49, respectively, are normally closed. When in this state, capacitor C9 will be at a voltage REF2 which is slightly below ground and capacitor C10 will be at ground. On arrival of signal T1, switch 51 will open causing capacitor C9 to start charging up, i.e. decaying in an upward direction. A short fixed time thereafter comparator U9 will start outputting a pulse INT and a pulse $\overline{\text{INT}}$. Upon the arrival of pulse T2, signifying the end of the time interval to be stretched, switch 53 will be closed causing capacitor C10 to start charging up, i.e. decaying in an upward direction. Because the two RC networks have different time constants, and in particular because the time constant of RC network 49 is less than that of RC network 47, at some time later the amplitude of the voltages in both RC networks will be the same (i.e. crossover). At this point in time comparator U9 will terminate pulses INT and $\overline{\text{INT}}$. Thus, the width of each of pulses INT and $\overline{\text{INT}}$ will be an expansion of the time difference between pulses T1 and T2.

Figure 6:
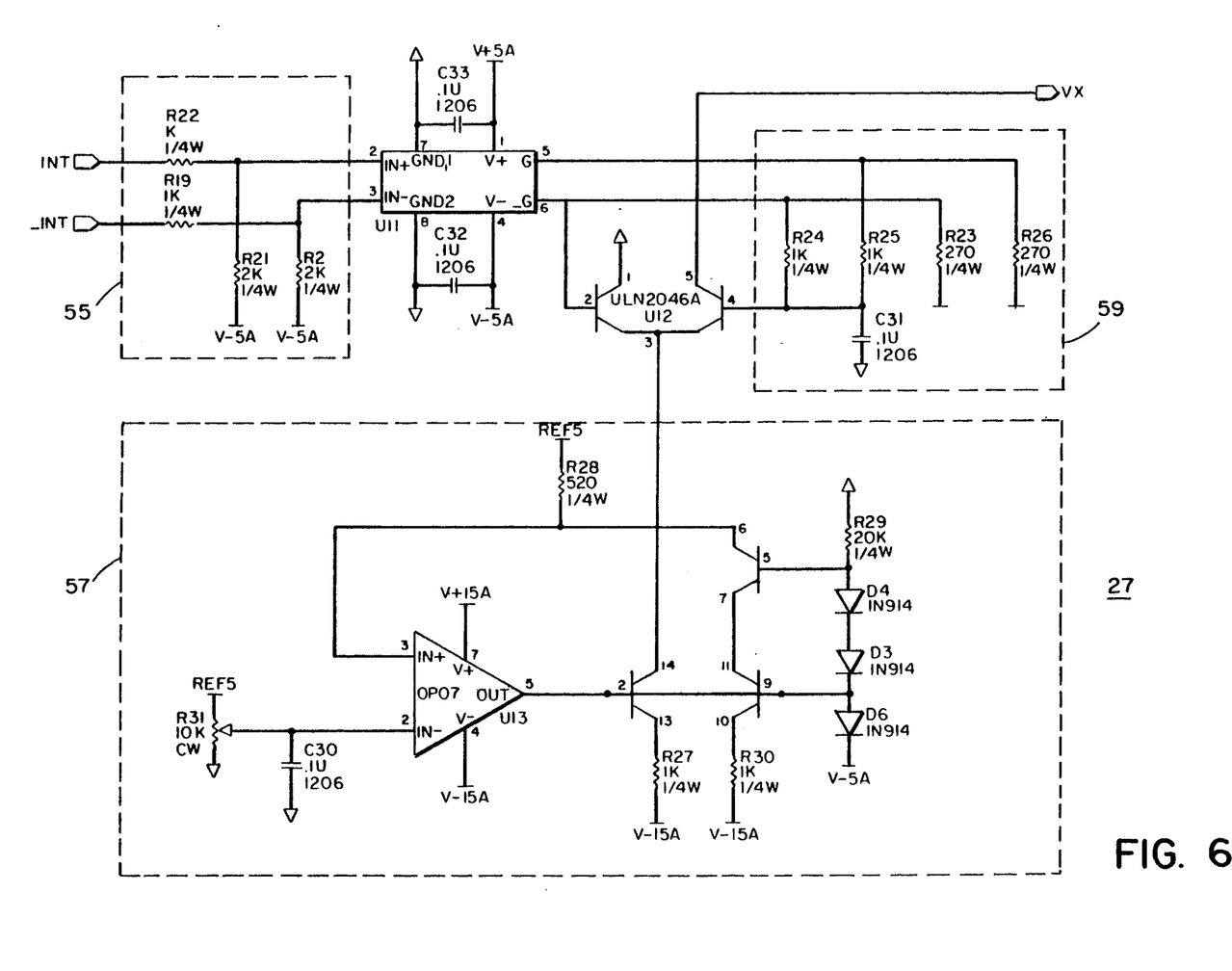
FIG. 6 is a schematic diagram of the output voltage generator in the TDC in FIG. 3.

Output voltage generator 27, which is shown in detail in FIG. 6, includes a comparator U11 which serves as a driver for a linear current switch U12, a level shifter 55 which matches the input range of driver U11, a linear current source 57 and associated circuitry 59.

Figure 7:
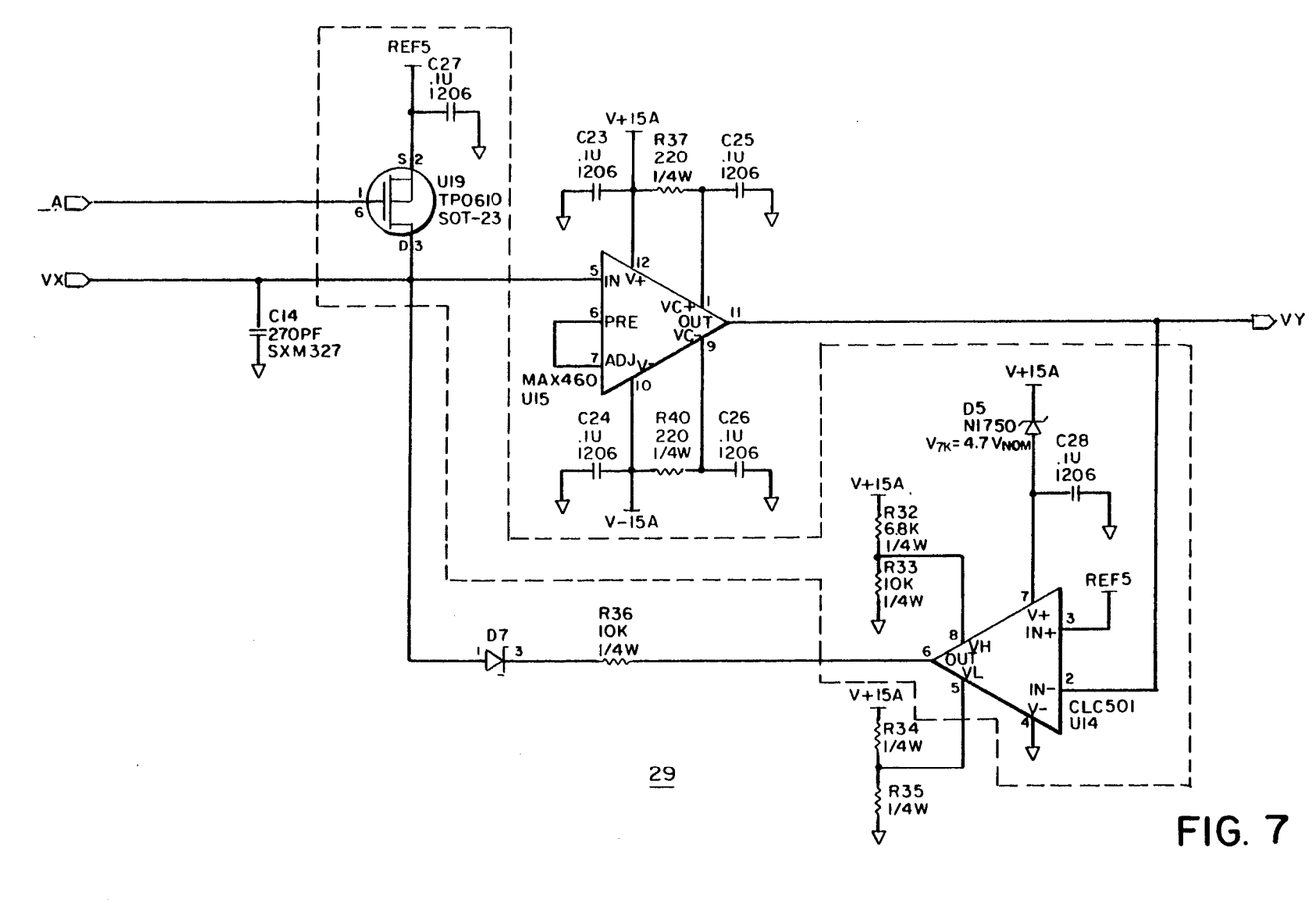
FIG. 7 is a schematic diagram of the buffer and reset circuit in the TDC in FIG. 3.

Buffer and reset circuit 29, which is shown in detail in FIG. 7 includes a buffer U15 which buffers the output signal VY and a reset circuit 61 which includes an op-amp U14 a PMOS transistor U19.

Figure 8:
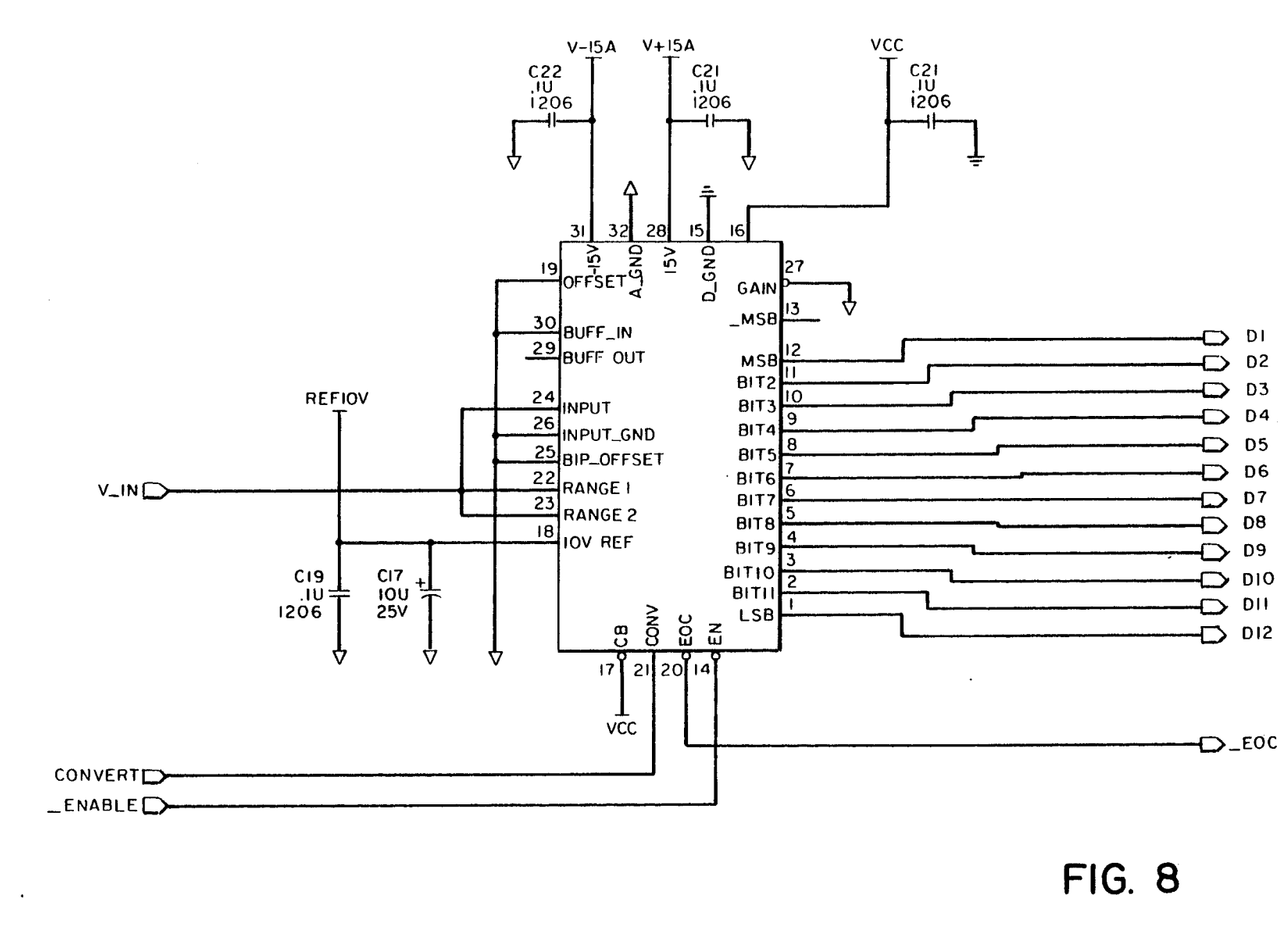
FIG. 8 is a schematic diagram of the analog-to-digital converter in the TDC in FIG. 3.

ADC converter 31, which is shown in detail in FIG. 8 includes an ADC chip U18 and associated circuitry.

Figure 9:
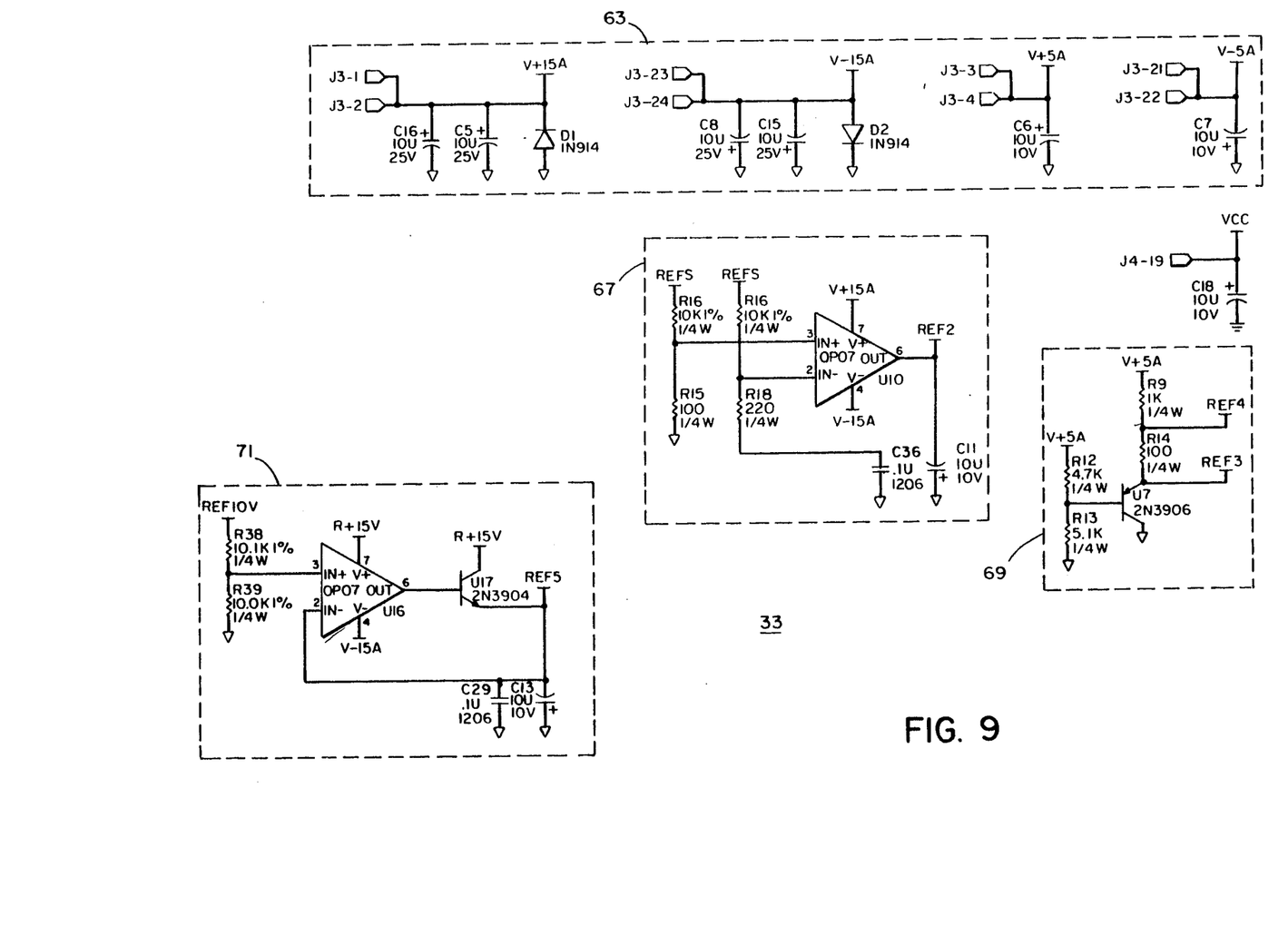
FIG. 9 are schematics of the power supplies and reference voltage circuit in the TDC in FIG. 3.

Power supplies and reference voltages 33 which is shown in more detail in FIG. 9 includes a set of power supplies 63, a pair of circuits 65 and 67 which generate reference voltages for time scaling circuit 25 and a circuit 71 for generating a pedestal voltage for output voltage generator 27.

Figure 10:
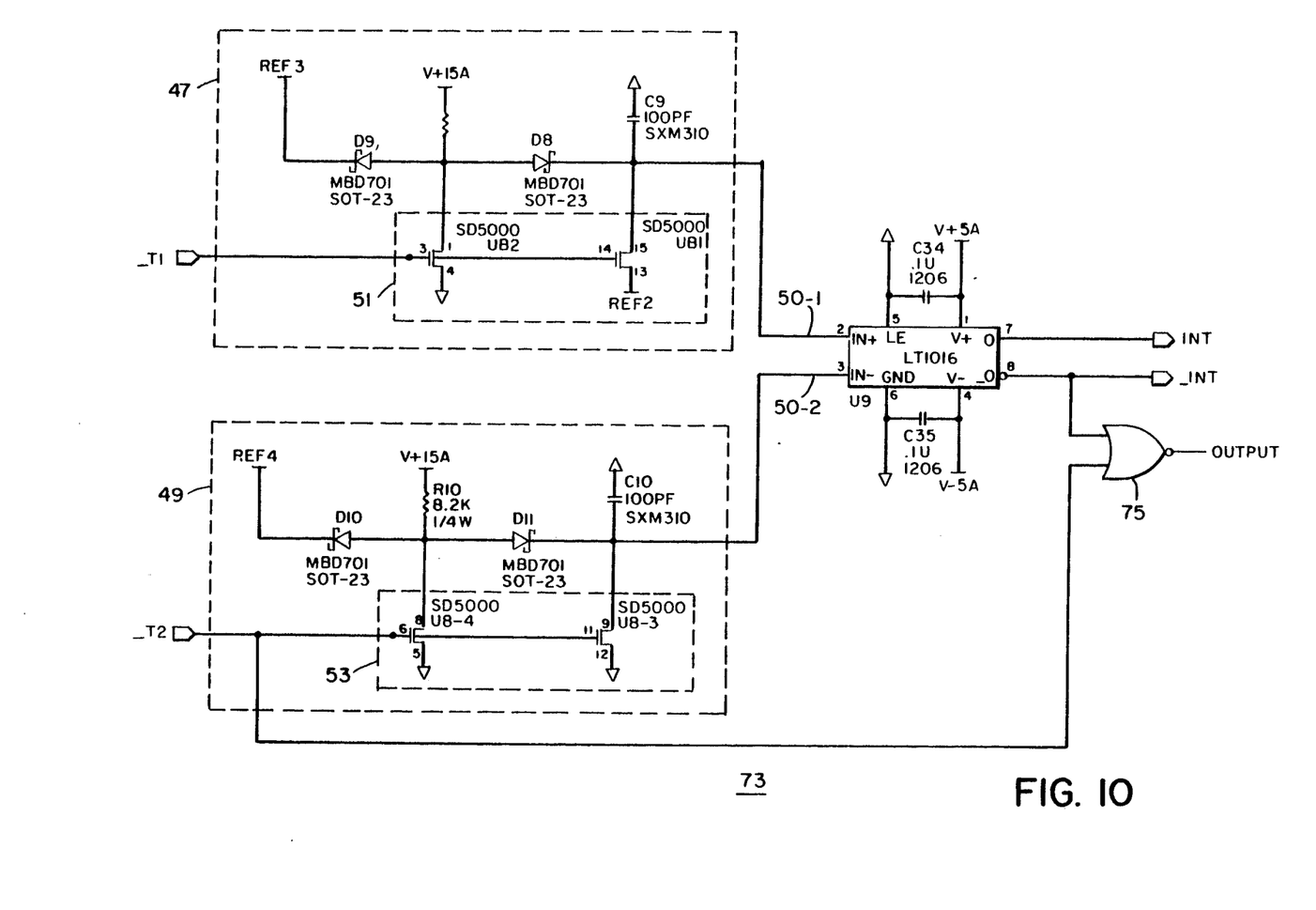
FIG. 10 is a schematic diagram of a modification of the time interval scaling circuit shown in FIG. 5.

Referring now to FIG. 10 there is shown a modification of the time scaling circuit shown in FIG. 5, the modification being identified by reference numeral 73. Time scaling circuit 73 differs from time scaling circuit 25 in that it includes a NOR gate 75 which receives $\overline{\text{T}}_2$ and $\overline{\text{INT}}$ signals. In addition, $\tau_1 > 2\tau_2$. Also, instead of a REF 2 voltage which is slightly negative there is a REF2$^1$ voltage which is slightly positive. The output pulse from NOR gate 75 has a width which corresponds to a compressed version of the time interval being measured. Time scaling circuit 73 may be used, for example, to generate narrow pulses whose width can be precisely controlled. If REF2$^1$ is made slightly negative rather than slightly positive, and $\tau_1 < \tau_2 < 2\tau_2$, then circuit 73 can be used to expand a pulse.

The embodiments of the present invention described above are intended to be merely exemplary and those skilled in the art shall be able to make numerous variations and modifications to it without departing from the spirit of the present invention. All such variations and modifications are intended to be within the scope of the present invention as defined in the appended claims.

What is claimed is:

1. A circuit for scaling the time interval between a first electrical pulse and a second electrical pulse comprising:
   a) a first resistance-capacitance network for producing a first electrical signal, said first resistance-capacitance network including switch means for receiving said first electrical pulse and initiating in response thereto the decay of said first electrical signal;
   b) a second resistance-capacitance network for producing a second electrical signal, said second resistance capacitance network including switch means for receiving said second electrical pulse and initiating in response thereto the decay of said second electrical signal,
   c) the time constants of said first and second resistance-capacitance networks being different, said first and second electrical signals having about the same amplitude initially, and
   d) a comparator for receiving said first and second electrical signals and producing an output voltage pulse whose width is proportional to the time interval to be scaled.

2. The circuit of claim 1 and wherein the time constants of the two resistance-capacitance networks are sized relative to each other so as to expand the time interval being scaled.

3. The circuit of claim 1 and wherein the time constants of the two resistance-capacitance networks are sized relative to each other so as to compress the time interval being scaled.

4. The circuit of claim 1 and wherein the switch means in each resistance-capacitance network comprises DMOS transistor type switches.

5. The circuit of claim 1 and wherein the output voltage has a width corresponding to the time interval between the start of the decay of the first resistance-capacitance network and the time when the decaying electrical signals are equal in amplitude.

6. A method of scaling a time interval comprising:
   a. providing a pair of RC networks having different time constants,
   b. maintaining said pair of RC networks initially at the same voltage,
   c. causing the voltage on one of the RC networks to decay at the start of the time interval and the other RC network to decay at the completion of the time interval,
   d. generating a voltage pulse whose width corresponds to the time between when the two decaying voltages are equal and either the start or the stop of the time interval.

7. A time-to-digital converter system for converting a short time interval into a digital signal output, said time-to-digital converter system comprising:
   a) an input section for receiving start and stop signals corresponding to the start and stop of said short time interval and outputting first and second electrical pulses, corresponding in time to said start and stop signals, respectively,
   b) a time interval scaling circuit for receiving said first and second electrical voltage pulses and producing a voltage pulse whose width is proportionately larger than the time interval between said first and second electrical pulses;
   c) an output voltage generator for receiving said voltage pulse from said time interval scaling circuit and producing a voltage signal whose amplitude is proportional to the width of the voltage pulse,
   d) means for buffering the voltage signal outputted by said current switch and for resetting said buffering means, and
   e) an analog to digital converter for converting the voltage signal output of the buffering and resetting means into a digital signal output.

* * * * *